United States Patent
Yoshida

(10) Patent No.: US 9,414,514 B2
(45) Date of Patent: Aug. 9, 2016

(54) DISPLAY APPARATUS

(75) Inventor: Kenji Yoshida, Tokyo (JP)

(73) Assignee: NEC DISPLAY SOLUTIONS, LTD., Tokyo (JP)

( * ) Notice: Subject to any disclaimer, the term of this patent is extended or adjusted under 35 U.S.C. 154(b) by 148 days.

(21) Appl. No.: 14/347,615

(22) PCT Filed: Sep. 30, 2011

(86) PCT No.: PCT/JP2011/072553
§ 371 (c)(1),
(2), (4) Date: Apr. 14, 2014

(87) PCT Pub. No.: WO2013/046432
PCT Pub. Date: Apr. 4, 2013

(65) Prior Publication Data
US 2014/0233164 A1    Aug. 21, 2014

(51) Int. Cl.
*H05K 7/14*    (2006.01)
*G02F 1/1333*    (2006.01)
*G02F 1/1362*    (2006.01)

(52) U.S. Cl.
CPC ............ *H05K 7/14* (2013.01); *G02F 1/133308* (2013.01); *G02F 2001/13332* (2013.01); *G02F 2001/136254* (2013.01); *G02F 2201/58* (2013.01); *G09G 2360/141* (2013.01); *G09G 2360/145* (2013.01)

(58) Field of Classification Search
CPC ................ G02F 1/133308; G02F 2001/13332; G02F 2001/136254; H05K 7/14; G09G 2360/14; G09G 2360/141; G09G 2360/145
See application file for complete search history.

(56) References Cited

U.S. PATENT DOCUMENTS

2006/0055690 A1\* 3/2006 Hashidume ......... G02F 1/13318
345/207

FOREIGN PATENT DOCUMENTS

| EP | 1 619 540 A1 | 1/2006 |
|---|---|---|
| JP | 2001-265296 A | 9/2001 |
| JP | 2010-141239 A | 6/2010 |
| JP | 2011-95600 A | 5/2011 |
| WO | WO 2004/097510 A1 | 11/2004 |
| WO | WO 2011/048853 A1 | 4/2011 |
| WO | WO 2011/114377 A1 | 9/2011 |

OTHER PUBLICATIONS

International Search Report in PCT/JP2011/072553 dated Dec. 27, 2011 (English Translation Thereof).

\* cited by examiner

*Primary Examiner* — Stephen F Husar
(74) *Attorney, Agent, or Firm* — McGinn IP Law Group PLLC

(57) ABSTRACT

A display apparatus includes: a display panel which has a display surface; an apparatus base to which the display panel is attached; a detecting unit which has a detecting surface disposed so as to face a region to be inspected being a part of the display surface, the detecting unit detecting by means of the detecting surface, light emitted from the region to be inspected, and outputting a detection result; and a case which supports the detecting unit, and is attached to a peripheral area of the region to be inspected.

19 Claims, 3 Drawing Sheets

DISPLAY APPARATUS

TECHNICAL FIELD

The present invention relates to a display apparatus that emits light from a display surface.

BACKGROUND ART

Heretofore, a variety of structures have been considered for the purpose of stabilizing the state of light emitted from the display surface of a display apparatus so that a user can see the display surface stably.

For example, in a display apparatus disclosed in Patent Document 1, a display unit including a liquid crystal panel (display panel) and a backlight is attached to a frame (apparatus base).

The aforementioned frame overlays an edge part of the display surface of the liquid crystal panel. A mounting substrate is attached to the frame by a mounting fitting. The cross-sectional shape of the mounting fitting in a plane including the thickness direction of the liquid crystal panel is formed in an L-shape. A horizontal segment of the mounting fitting is attached to the top surface of the frame with screws, and a vertical segment of the mounting fitting hangs down a little above the front of the display surface.

The front surface of the base part of the mounting substrate is fastened by solder to the rear surface of the vertical segment of the mounting fitting. A chip shaped luminance sensor (detecting unit) is installed on a convex part of the mounting substrate, and the luminance sensor faces the display surface of the liquid crystal panel.

The display apparatus constructed as above can measure the luminance of the display surface by the luminance sensor, and adjust the luminance automatically.

RELATED ART DOCUMENT

Patent Document

[Patent Document 1] PCT International Publication No. WO 2004/097510

SUMMARY OF THE INVENTION

Problem to be Solved by the Invention

However, in the display apparatus of Patent Document 1, in a case where the position of a display unit mounted in a frame is shifted, the position of the display surface relative to the luminance sensor is shifted, so there is a problem in that the luminance of the display surface cannot be measured by the luminance sensor stably. Furthermore, there is also a type of display apparatus that has a region to be inspected provided on part of the display surface for the purpose of being measured by a luminance sensor. The region to be inspected is formed such that it cannot be seen by a user, and a special image is displayed for detection.

The present invention has been made in view of such problems, and an object thereof is to provide a display apparatus that can stably measure the state of the region to be inspected of a display surface by a detecting unit.

Means for Solving the Problem

In order to solve the above problems, this invention proposes the following measures.

A display apparatus of the present invention includes: a display panel which has a display surface; an apparatus base for attaching the display panel; a detecting unit which has a detecting surface disposed so as to face a region to be inspected being a part of the display surface, the detecting unit detecting by means of the detecting surface, light emitted from the region to be inspected, and outputting a detection result; and a case which supports the detecting unit, and is attached to a peripheral area of the region to be inspected.

Effect of the Invention

According to the display apparatus of the present invention, even if the attached position of the display panel to the apparatus base is shifted, the case that supports the detecting unit is attached to the peripheral area of a region to be inspected. As a result, the position of not only the display panel but also the position of the detecting unit are shifted together with the display panel to the apparatus base, and thus it is possible to prevent the detection results from being changed by the position of the region to be inspected being shifted relative to the detecting surface. Accordingly, it is possible to stably measure the state of the region to be inspected on the display surface by the detecting unit.

EMBODIMENTS FOR CARRYING OUT THE INVENTION

Hereunder is a description of an exemplary embodiment of a display apparatus according to the present invention, with reference to FIG. 1 to FIG. 6.

Figure 1:
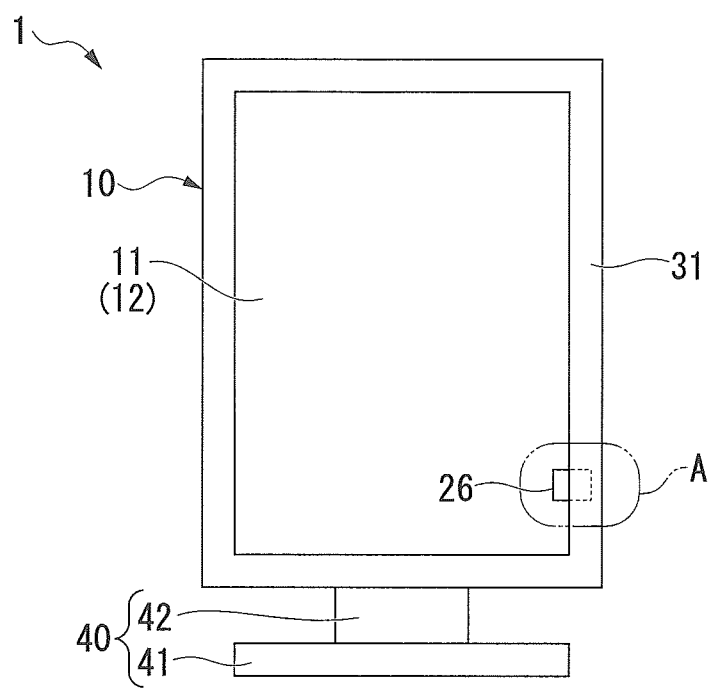
FIG. 1 is a front view of a display apparatus of one exemplary embodiment of the present invention.

As shown in FIG. 1, a display apparatus 1 of the present exemplary embodiment includes a liquid crystal display unit 10 having a liquid crystal panel (display panel) 11, and a support base 40 that supports the liquid crystal display unit 10 from below.

Figure 2:
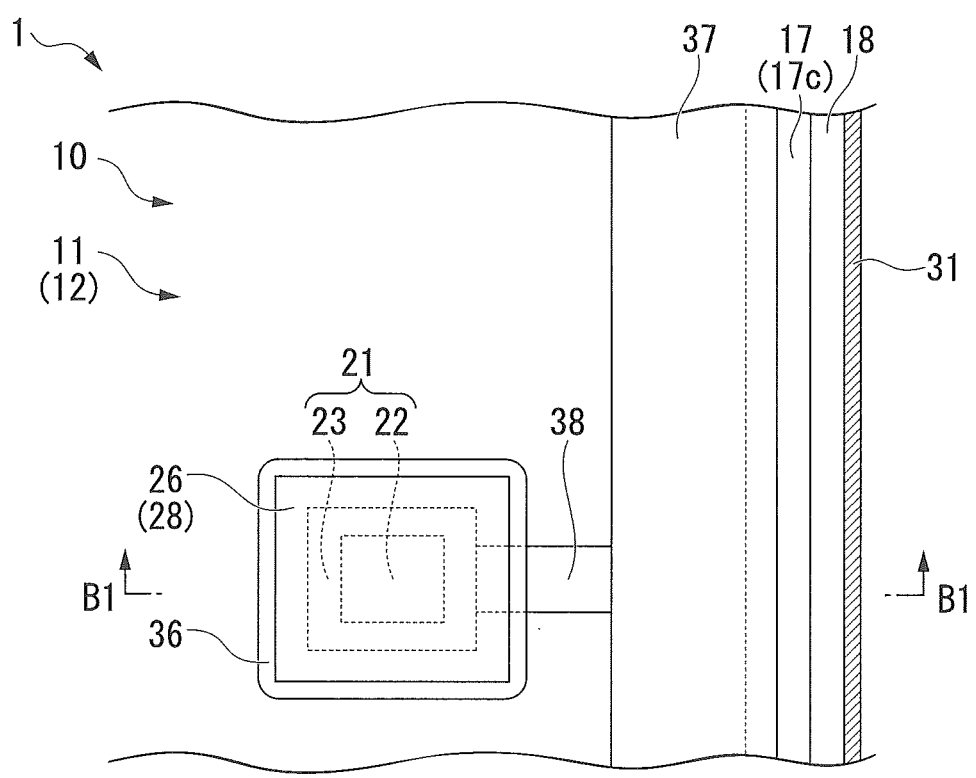
FIG. 2 is an enlarged view of region A of FIG. 1.
Figure 3:
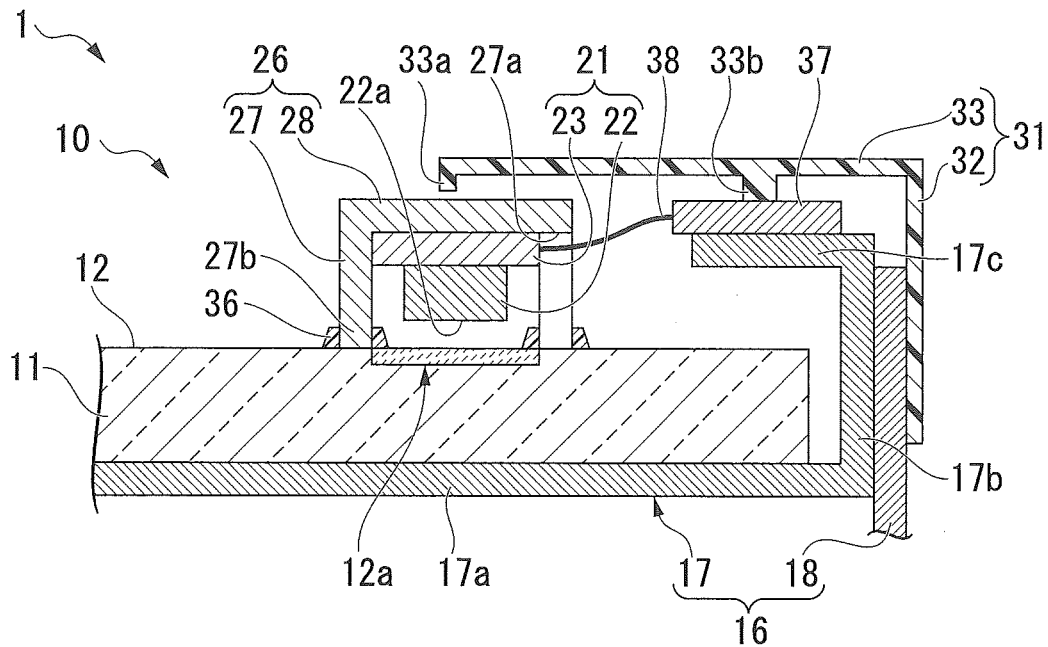
FIG. 3 is a cross-sectional diagram along the cutting plane line B1-B1 of FIG. 2.

The liquid crystal display unit 10, as shown in FIG. 2 and FIG. 3, includes the aforementioned liquid crystal panel having a display surface 12, an apparatus base 16 for attaching the liquid crystal panel 11, a detecting unit 21 that detects visible light (light), and a case 26 that supports the detecting unit 21.

Figure 5:
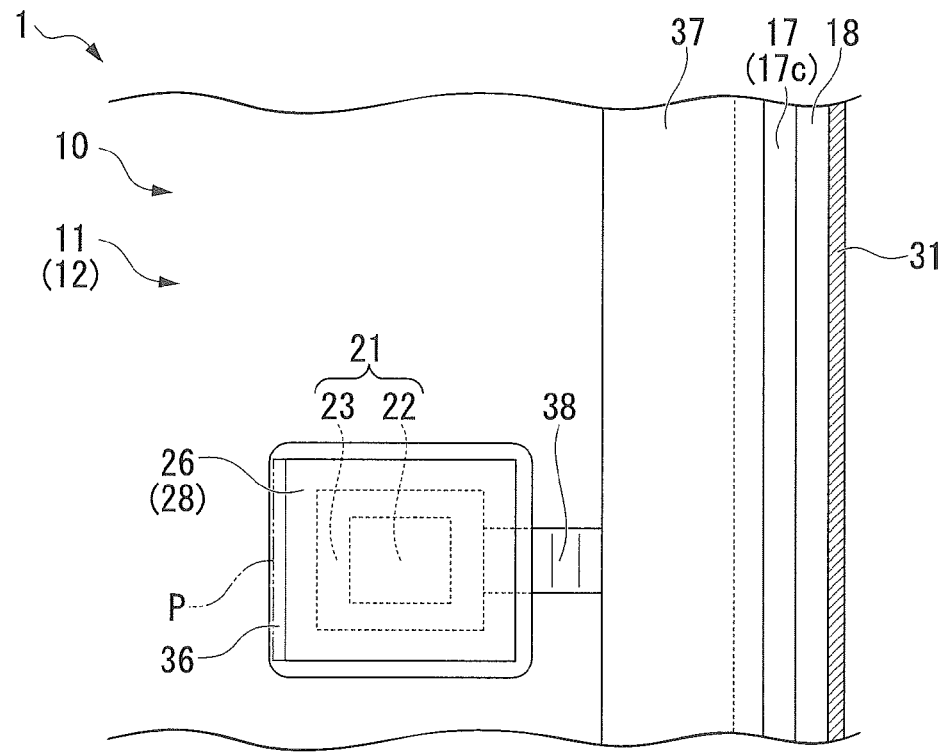
FIG. 5 is a front view of the main part corresponding to FIG. 4.

FIG. 2, and in FIG. 5 to be described later show with part of a bezel 31 mentioned later, broken away.

The liquid crystal panel 11 is formed in a substantially rectangular plate shape when viewed from the front. The display surface 12 is set on one of the main surfaces of the liquid crystal panel 11, and the side of the display surface 12 is the front surface of the display apparatus 1.

A region to be inspected 12a is set at the edge part of the display surface 12. Visible light for displaying images and characters is emitted from the display surface 12 including the region to be inspected 12a. In this example, visible light emitted from the region to be inspected 12a is formed such that it cannot be seen by a user, and a special image for detection is displayed in the region to be inspected 12a. To be specific, the region to be inspected 12a includes a peripheral section and an inspection pattern section surrounded by the peripheral section. Black is displayed in the peripheral section. In the inspection pattern section, a pattern is displayed in which the shade changes from white to black in steps. That is, in the region to be inspected 12a, the inspection pattern section is in the center, and the peripheral section displayed in black surrounds the inspection pattern section.

The liquid crystal panel 11 can be connected to an external signal transmission apparatus via an image processing board and a signal cable (not shown in the figure) provided in the display apparatus 1. A signal indicating characters and images transmitted from the signal transmission apparatus is processed by the image processing board, and is displayed on the display surface 12 of the liquid crystal panel 11.

The apparatus base 16 has a frame 17 to which the other main surface of the liquid crystal panel 11 is attached, and a chassis base 18 joined to the frame 17.

The frame 17 includes a frame body 17a formed as a flat plate, a side plate 17b extending forward from the edge of the frame body 17a, and a front plate 17c extending parallel to the frame body 17a from the front edge of the side plate 17b. The front plate 17c extends to the edge part of the liquid crystal panel 11 such that it approaches the central part of the frame body 17a. The liquid crystal panel 11 is attached to the frame body 17a of the frame 17.

The chassis base 18 is formed such that it defines the external form of the liquid crystal display unit 10 on the rear face side of the liquid crystal display unit 10. The edge part of the chassis base 18 on the front face side is attached to the outer surface of the side plate 17b.

The frame 17 and the chassis base 18 are formed by bending a sheet metal such as stainless steel, for example.

A bezel (frame member) 31 is attached to the chassis base 18. The cross sectional shape of the bezel 31 in the plane including the thickness direction of the liquid crystal panel 11 is formed in an L-shape. The L-shaped cross section of the bezel 31 includes a side plate body 32 and a front plate body 33.

The edge part of the side plate body 32 on the rear side is attached to the outer surface of the chassis base 18. The front plate body 33 extends parallel to the front plate 17c from the front edge of the side plate body 32 with a space between the front plate 17c and the front plate body 33. The end of the front plate body 33 extends past the end of the front plate 17c in the direction along the display surface 12 of the liquid crystal panel 11.

An inner rib 33a that extends towards the rear face side is provided at the end of the front plate body 33. Furthermore, an outer rib 33b that extends towards the rear face side is provided in the central part between the inner rib 33a of the front plate body 33 and the side plate body 32.

The bezel 31 can be formed from resin using injection molding, for example.

The case 26 has a case body 27 formed in a square tube shape and a base part 28 that covers the front opening of the case body 27. A notch 27a is formed in the side face of the case body 27. The case 26 can be formed from resin using injection molding, for example.

The edge part 27b of the opening on the rear face side of the case body 27 is attached directly to the peripheral area of the region to be inspected 12a of the display surface 12 using an adhesive 36.

For the adhesive 36, it is preferable to use a substance that hardens in a short time, such as a UV (ultraviolet light) hardening adhesive.

The base part 28 of the case 26 is disposed in a location facing the inner rib 33a of the bezel 31.

When attaching the case 26 to the display surface 12 of the liquid crystal panel 11, in a state in which the edge part 27b of the case 26 makes contact with the display surface 12, they are aligned in the direction along the display surface 12 using a jig engaged with both the edge part of the liquid crystal panel 11 and the case 26, for example. In this state, the peripheral area of the region to be inspected 12a and the edge part 27b of the case 26 are fastened with adhesive 36.

By attaching the case 26 to the display surface 12 of the liquid crystal panel 11 in such a procedure, it is possible to attach the case 26 to the display surface 11 accurately.

The detecting unit 21 includes a luminance sensor 22 having a detecting surface 22a and a sensor board 23 on which the luminance sensor 22 is provided. The detecting unit 21 is housed in the case 26, and the sensor board 23 is fixed to the base part 28 of the case 26. The detecting surface 22a is disposed such that it faces the region to be inspected 12a.

The detecting unit 21 can detect visible light emitted from the region to be inspected 12a of the liquid crystal panel 11 by means of the detecting surface 22a to obtain the luminance of the visible light, and can output the value of the obtained luminance to the outside as a detection result.

A circuit board 37 is arranged between the front plate 17c of the frame 17 and the outer rib 33b of the bezel 31. The circuit board 37 is attached to the front plate 17c.

This circuit board 37 and the sensor board 23 are connected by a known flexible printed board (wiring part) 38. The flexible printed board 38 is inserted into the notch 27a of the case 26.

The aforementioned detection result detected by the detecting unit 21 is transmitted to the circuit board 37 via the flexible printed board 38 as an electrical signal. The circuit board 37 can adjust the luminance of visible light emitted from the display surface 12 of the liquid crystal panel 11 based on the transmitted detection result.

The support base 40, as shown in FIG. 1, includes a base 41 formed in a flat plate shape and a pivot column 42 which extends in a protruding direction protruding from the main surface of the base 41, and is formed such that it can rotate around an axis parallel to the protruding direction from the base 41. The end of the pivot column 42 is attached to the chassis base 18.

Using the support base 40 formed in this manner, the liquid crystal display unit 10 can be rotated around the axis parallel to the vertical direction in a state in which the base 41 is disposed on a table or the like, and thereby the direction in which the display surface 12 faces can be adjusted.

Next is a description of the operation of the display apparatus 1 constructed as above.

When the display apparatus 1 is started, the liquid crystal panel 11, the detecting unit 21, the circuit board 37, and the image processing board are started.

When a signal is transmitted from the signal transmitting apparatus via the signal cable, the signal is processed by the image processing board, and images and characters are displayed on the display surface 12 of the liquid crystal panel 11.

Visible light emitted from parts other than the region to be inspected 12a on the display surface 12 is viewed by a user.

Visible light emitted from the region to be inspected 12a on the display surface 12 is detected by the detecting surface 22a disposed such that it faces the region to be inspected 12a. The luminance of the detected visible light is converted to a numeric value by the detecting unit 21, and transmitted to the circuit board 37 via the flexible printed board 38 as a detection result. The circuit board 37 adjusts the luminance of the visible light emitted from the display surface 12 of the liquid crystal panel 11 based on the transmitted detection result.

By the above operation, the luminance of the display surface 12 is adjusted to a predetermined value.

Figure 4:
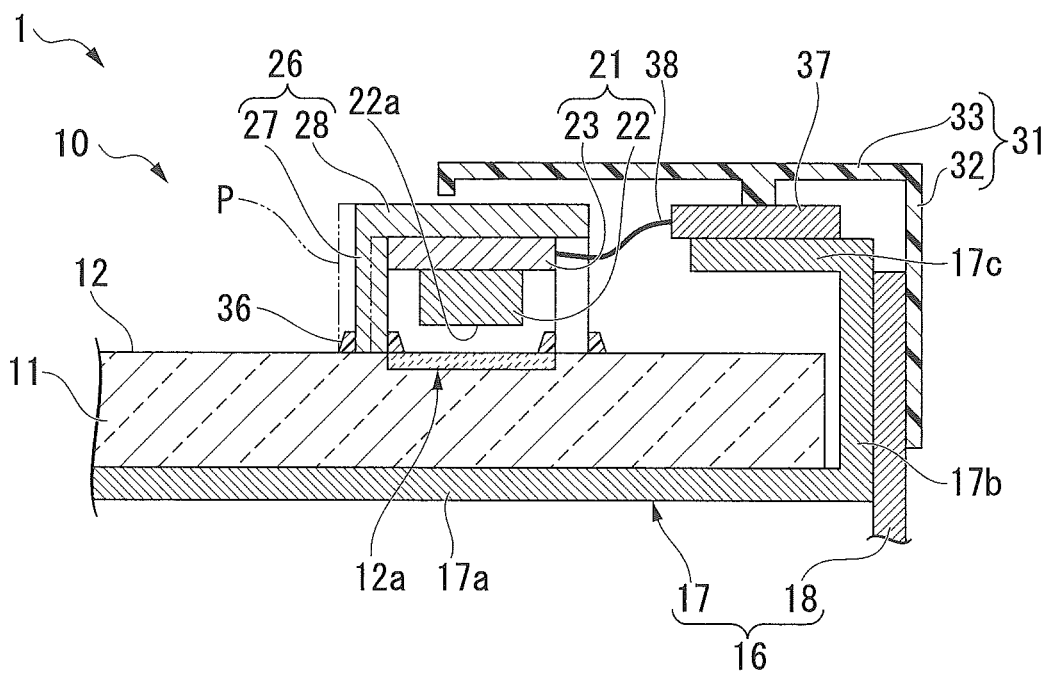
FIG. 4 is a cross-sectional diagram of a main part for explaining a case in which the position of a display panel is shifted relative to an apparatus base in the display apparatus.

When manufacturing the display apparatus 1, there is a case where the position of the liquid crystal panel 11 attached to the frame body 17a of the frame 17 is shifted. To be specific, as shown in FIG. 4 and FIG. 5, an example is described in which the position of the liquid crystal panel 11 attached to the frame body 17a is shifted toward the edge part side of the liquid crystal panel 11 away from a reference position P.

In this case, since the detecting unit 21 is attached to the display surface 12 of the liquid crystal panel 11 via the case 26, the detecting unit 21 moves together with the liquid crystal panel 11. Further more, since the position of the sensor board 23 relative to the circuit board 37 shifts, the flexible printed board 38 that is connected to the sensor board 23 of the detecting unit 21 and the circuit board 37 deforms and bends.

As described above, according to the display apparatus 1 of the present exemplary embodiment, even in a case where the position of the liquid crystal panel 11 is shifted relative to the apparatus base 16, the case 26, which supports the detecting unit 21, is attached to the peripheral area of the region to be inspected 12a by the adhesive 36. As a result, by the position of not only the liquid crystal panel 11 but also the detecting unit 21 being shifted together relative to the apparatus base 16, the position of the region to be inspected 12a is prevented from shifting relative to the detecting surface 22a, and the detection result by the detecting unit 21 is prevented from being changed. Consequently, the state of the region to be inspected 12a of the display surface 12 can be stably measured by the detecting unit 21.

When the attached position of the display panel 11 is shifted relative to the apparatus base 16, the position of the circuit board 37 attached to the apparatus base 16 relative to the detecting unit 21 attached to the display panel 11 via the case 26 is shifted. However, since the circuit board 37 and the detecting unit 21 are connected by the flexible printed board 38, by the flexible printed board 38 flexing, it is possible to accommodate the shift in the position of the circuit board 37 relative to the detecting unit 21.

In a conventional display apparatus, in order to detect a visible light emitted from a region to be inspected reliably even if the position of the region to be inspected is shifted relative to a detecting surface, the region to be inspected was set to be large or the detecting surface was of a large form. In the case where the detecting surface is of a large form, the external shape of the case in which a detecting unit having the detecting surface is fixed also becomes large.

By contrast, in the display apparatus 1 of the present exemplary embodiment, since the position of the region to be inspected 12a relative to the detecting surface 22a is prevented from being shifted, it is possible to set a small region to be inspected 12a, and also to construct the detecting unit 21 and the case 26 in a compact external shape.

One exemplary embodiment of the present invention is described in detail above with reference to the drawings. However, specific constructions are not limited to this exemplary embodiment, and any structural change or the like that does not depart from the scope of the present invention is also included.

Figure 6:
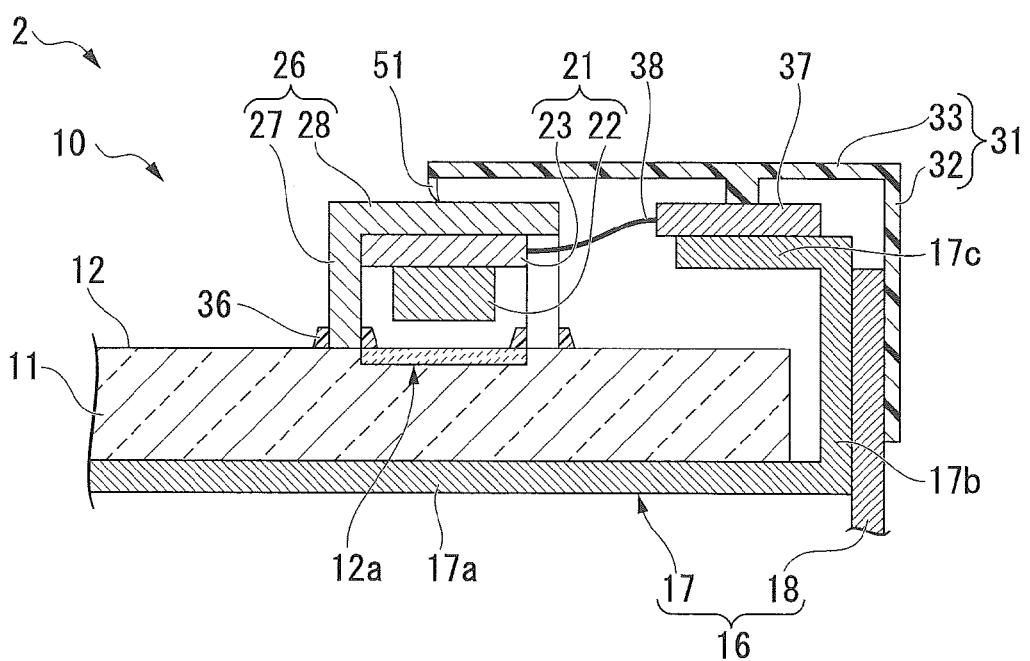
FIG. 6 is a cross-sectional diagram of the main part of a display apparatus in a modified example of the exemplary embodiment of the present invention.

For example, in the above-described exemplary embodiment, as shown in the display apparatus 2 of FIG. 6, a fin member (elastic member) 51, which is arranged such that one end part is fixed to the end of the front plate body 33 and the other end part makes contact with the outer face of the case 26, may be provided. In this example, the inner rib 33a is not provided on the front plate body 33.

By constructing the display apparatus 2 in this manner, even if the attached position of the display panel 11 to the apparatus base 16 is shifted, the other end part of the fin member 51 makes contact with the outer face of the case 26. Consequently, the space between the bezel 31 and the case 26 is occupied by the fin member 51, so that it is possible to improve the appearance of the display apparatus 2.

In the present modified example of the display apparatus 2, it is possible to use rubber as a suitable elastic member instead of the fin member 51.

Furthermore, in the exemplary embodiment, the display panel is a liquid crystal panel. However, the display panel is not limited to this, and it may be a TFT (Thin Film Transistor) panel, an organic EL (Electro-Luminescent) panel, or the like.

Light emitted from the region to be inspected 12a is visible light. However, this is not a limitation, and the light may be infrared rays or the like.

In the exemplary embodiment, the detecting unit 21 has a sensor that detects the luminance of a visible light by the detecting surface 22a. However, the sensor used in the detecting unit is not limited to this, and it may be a color sensor that detects each of the three primary colors of light.

The wiring part is a flexible printed board 38. However, this is not a specific limitation provided the wiring part is flexible, and typical flexible electrical wiring may be used.

INDUSTRIAL APPLICABILITY

A display apparatus of the present invention can be used widely in order to display a variety of images and information in offices, factories, the medical field, and the like.

REFERENCE SYMBOLS 1, 2 Display apparatus
11 Liquid crystal panel (display panel)
12 Display surface
12a Region to be inspected
16 Apparatus base
21 Detecting unit
22a Detecting surface
26 Case
31 Bezel (frame member)
37 Board
38 Flexible printed board (wiring part)
51 Fin member (elastic member)

The invention claimed is:
1. A display apparatus comprising:
a display panel which has a display surface;
an apparatus base for attaching the display panel;
a frame member which is attached to the apparatus base;
a detecting unit which is disposed so as to face a region to be inspected, the region to be inspected being a part of the display surface; and
a case which houses the detecting unit therein,
wherein the detecting unit detects light emitted from the region to be inspected, and
wherein the case is fastened to the display surface.

2. The display apparatus according to claim 1, further comprising:
- a wiring part which has flexibility and is connected to the detecting unit, the wiring part transmitting the detection result of the detecting unit; and
- a circuit board which is attached to the apparatus base and is connected to the wiring part, the circuit board adjusting light emitted from the display surface based on the detection result.

3. The display apparatus according to claim 1, further comprising:
- an elastic member which has a first end part fixed to the frame member, and a second end part making contact with an outer face of the case.

4. The display apparatus according to claim 1, wherein the case is adhered to the display surface.

5. The display apparatus according to claim 1, further comprising:
- an adhesive which fastens the case to the display surface.

6. The display apparatus according to claim 1, wherein the case is fastened to the display surface such that a position of the region to be inspected relative to the detecting unit is prevented from being shifted.

7. The display apparatus according to claim 1, further comprising a frame that includes:
- a frame body;
- a side plate extending forward from an edge of the frame body; and
- a front plate extending parallel to the frame body from a front edge of the side plate.

8. The display apparatus according to claim 7, wherein the front plate extends to an edge part of the display panel such that the front plate approaches a central part of the frame body, and
- wherein the display panel is attached to the frame body of the frame.

9. The display apparatus according to claim 7, further comprising a chassis base joined to the frame.

10. The display apparatus according to claim 9, wherein an edge part of the chassis base on a front face side of the display panel is attached to an outer surface of the side plate.

11. The display apparatus according to claim 1, wherein the frame member comprises an L-shaped cross section.

12. The display apparatus according to claim 9, wherein the frame member comprises an L-shaped cross section and includes:
- a side plate body, an edge part of the side plate body being attached to an outer surface of the chassis base; and
- a front plate body.

13. The display apparatus according to claim 10, wherein the frame member comprises an L-shaped cross section and includes:
- a side plate body, an edge part of the side plate body being attached to an outer surface of the chassis base; and
- a front plate body that extends parallel to the front plate from the front edge of the side plate body with a space between the front plate and the front plate body.

14. The display apparatus according to claim 13, wherein an end of the front plate body extends past an end of the front plate in a direction along the display surface.

15. The display apparatus according to claim 1, wherein the case includes a case body having a rear face side, an opening being formed on the rear face side,
- wherein an edge part of the opening on the rear face side of the case body of the case is attached to a peripheral area of the region to be inspected.

16. The display apparatus according to claim 1, wherein the case includes a case body having a rear face side, an opening being formed on the rear face side,
- wherein an edge part of the opening on the rear face side of the case body of the case is attached directly to a peripheral area of the region to be inspected.

17. The display apparatus according to claim 1, wherein the case is fastened to the display surface such that an edge part of the case contacts with the display surface.

18. The display apparatus according to claim 2, wherein a shift in a position of the circuit board relative to the detecting unit is accommodated by a flexing of the wiring part.

19. A luminance measurement method for a display device, the method comprising:
- disposing a detecting unit of the display device so that the detecting unit faces a region to be inspected, the region to be inspected being of a display surface of the display device;
- housing the detecting unit in a case of the display device;
- fastening the case to the display surface; and
- detecting light emitted from the region to be inspected using the detecting unit.

* * * * *